(12) United States Patent
Watanabe

(10) Patent No.: US 6,476,651 B1
(45) Date of Patent: Nov. 5, 2002

(54) POWER-OFF DETECTION CIRCUIT

(75) Inventor: Hiroshi Watanabe, Beppu (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/865,254

(22) Filed: May 25, 2001

(30) Foreign Application Priority Data

May 29, 2000 (JP) ......................................... 2000-157572

(51) Int. Cl.[7] ................................................ H03L 7/00
(52) U.S. Cl. ........................ 327/143; 327/142; 327/198
(58) Field of Search ................................. 327/142, 143, 327/198, 427, 437; 359/750.08

(56) References Cited

U.S. PATENT DOCUMENTS 5,828,251 A * 10/1998 Freyman et al. ............ 327/143
5,898,327 A * 4/1999 Tanaka ........................ 327/143
6,281,723 B1 * 8/2001 Tailliet ........................ 317/143

* cited by examiner

Primary Examiner—My-Trang Nuton
Assistant Examiner—Hiep Nguyen
(74) Attorney, Agent, or Firm—William B. Kempler; W. James Brady; Frederick J. Telecky, Jr.

(57) ABSTRACT

The object of the invention is to provide a power-off detection circuit with low power consumption and little dependence on power supply voltage. Detecting capacitor 11 is charged by the power supply voltage Vcc. When the power supply voltage Vcc drops at the time of power off, the drop is detected by starting transistor 14. Said detecting transistor 11 is discharged, and the discharge current is supplied to gate voltage generating circuit 21. Gate voltage generating circuit 21 generates a gate voltage depending on the discharge current. As a result, output transistor 17 is turned on, and the signal at control terminal 35 is inverted. Another circuit can detect the power-off state depending on the signal at control terminal 35.

6 Claims, 4 Drawing Sheets

POWER-OFF DETECTION CIRCUIT

FIELD OF THE INVENTION

The present invention pertains to a circuit which can detect a drop in power supply voltage.

BACKGROUND OF THE INVENTION

A device known as a transfer IC is usually used to establish connection between independent systems on different substrates.

Since the independent systems are operated by different power supplies, ordinarily, power to each system is turned off individually. When there is a system whose power is turned off, excess current might flow from the transfer IC of a system which is in a power-on state to the transfer IC, which has been turned off. In a worst case scenario, the transfer IC might become damaged.

In order to prevent the aforementioned damage, a power-off detection circuit has been added in the transfer IC, which was recently developed. When the power-off detection circuit detects a power-off state, the output terminal of the system will be converted to a high impedance state to prevent the flow of excess current.

Reference numeral 100 in FIG. 6 represents a conventional power-off detection circuit incorporated in a transfer IC. In said power-off detection circuit 100, the power supply voltage Vcc is divided by two resistors 101 and 102. The divided voltage is input to the gate terminal of n-channel MOS transistor 103. If the voltage obtained by dividing the power supply voltage Vcc is higher than the threshold voltage of MOS transistor 103, MOS transistor 103 is turned on. If it is lower than the threshold voltage, MOS transistor 103 is turned off.

The drain terminal of MOS transistor 103 is connected to the power supply voltage Vcc via op-amp resistor 104 and is also input to buffer circuit 105.

In this case, an inverter is used for buffer circuit 105. When the power of the system is on, MOS transistor 103 is in a power-on state. Since a LOW signal is input to buffer circuit 105, a HIGH signal will be output from buffer circuit 105.

On the other hand, when the power supply voltage Vcc drops during a power-off state, MOS transistor 103 is turned off, and a LOW signal is output from buffer circuit 105.

The output signal of buffer circuit 105 is input to output driver circuit 106. When said output driver circuit 106 detects a LOW signal, the impedance control circuit contained in output driver circuit 106 outputs a high impedance to the output terminal of the system so that no large current can flow in from other systems in the power-on state.

In recent years, however, there has been a demand to reduce the power consumption of the transfer IC or other CMOS logic ICs. The current flowing through said resistors 101 and 102 used for dividing the power supply voltage Vcc cannot be ignored.

Also, power supply voltages Vcc with various magnitudes, such as 3.3 V, 2.5 V, and 2V, have been used in recent years in order increase the speed of a system and to reduce the power consumption. Consequently, it is required that the CMOS standard logic IC be able to operate at various power supply voltages Vcc.

However, if the power supply voltage Vcc is divided as described above, operation will not be possible at a power supply voltage which is different from the assumed power supply voltage Vcc.

One aspect of the present invention is to solve the aforementioned two problems of the conventional technology by providing a power-off detection circuit that has low power consumption and is not dependent on the power supply voltage.

SUMMARY OF THE INVENTION

In accordance with an aspect of the present invention provides a power-off detection circuit comprising the following parts: a diode, which is electrically connected between first and second power supply terminals; a first capacitor, which is electrically connected between the aforementioned diode and the second power supply terminal and is charged from the first power supply terminal via the aforementioned diode; a first output transistor, which is electrically connected between the aforementioned first and second power supply terminals to output logic signals; a control transistor, which is electrically connected between the node connecting the aforementioned diode to the first capacitor and the control terminal of the aforementioned first output transistor, with its control terminal electrically connected to the aforementioned first power supply terminal; and a voltage generating circuit which is electrically connected between the node connecting the aforementioned control transistor to the control terminal of the first output transistor and the second power supply terminal.

According to another aspect of the present invention, the power-off detection circuit also has a first reset transistor, which is electrically connected between the node connecting the aforementioned diode and the first capacitor and the aforementioned second power supply terminal, and which is turned on corresponding to a reset signal to discharge the aforementioned first capacitor.

According to a further aspect of the present invention, the power-off detection circuit also has a second output transistor, which is electrically connected between the aforementioned first power supply terminal and the first output transistor and which can apply a reset signal to its control terminal.

According to yet another aspect of the present invention, in the power-off detection circuit the aforementioned voltage generating circuit is comprised of resistors. When the aforementioned control transistor becomes conductive, a prescribed voltage is supplied to the control terminal of the aforementioned first output transistor, the conductive state of the aforementioned first output transistor is changed, and the aforementioned logic signal is inverted.

According to a still further aspect of the present invention, in the power-off detection circuit the aforementioned voltage generating circuit is comprised of two capacitors which are arranged in parallel with respect to the aforementioned second capacitor, and the power-off detection circuit has a second reset transistor which is turned on corresponding to the aforementioned reset signal to discharge the second capacitor.

According to yet another aspect of the present invention, in the power-off detection circuit the aforementioned voltage generating circuit is a transistor which can form a current mirror circuit together with the aforementioned first output transistor.

According to yet another aspect of the present invention, when the power supply voltage is constantly high, the first capacitor (detecting capacitor) is charged by the power supply voltage from the first power supply terminal via the diode.

When the power supply voltage drops after the first capacitor is fully charged, since the diode is reverse-biased, there is no current flowing from the first capacitor toward the power supply voltage. Consequently, any type of diode can be used in the present invention as long as it allows charging current to flow to the first capacitor when the diode is forward-biased and cuts off the first capacitor from the power supply voltage when the diode is reverse-biased. For example, a diode-connected transistor can be used.

When the power supply voltage drops and the control transistor (starting transistor) is turned on, the first capacitor is connected to the voltage generating circuit, and a discharge current is supplied via the control transistor.

The voltage generating circuit generates a voltage depending on the supplied discharging current and outputs the voltage to the first output transistor. The on/off state of the first output transistor is reversed by the voltage. That is, if the output transistor is off with the power supply voltage in a constantly high state, it will be turned on. On the other hand, if the output transistor is on, it will be turned off. Consequently, other circuits can detect a drop in the power supply voltage depending on the output signal (logic signal) of the output transistor.

REFERENCE NUMERALS AND SYMBOLS AS SHOWN IN THE DRAWINGS

In the figures, Vcc refers to a power supply voltage, 1–3 a power-off detection circuit, 11 a detection capacitor, 13 a diode, 14 a starting transistor, 16 a first reset transistor, 17 an output transistor, 21–23 a gate voltage generating circuit, 25 a resistor, 27 a diode-connected transistor, 29 a second reset transistor

DESCRIPTION OF THE EMBODIMENTS

Figure 1:
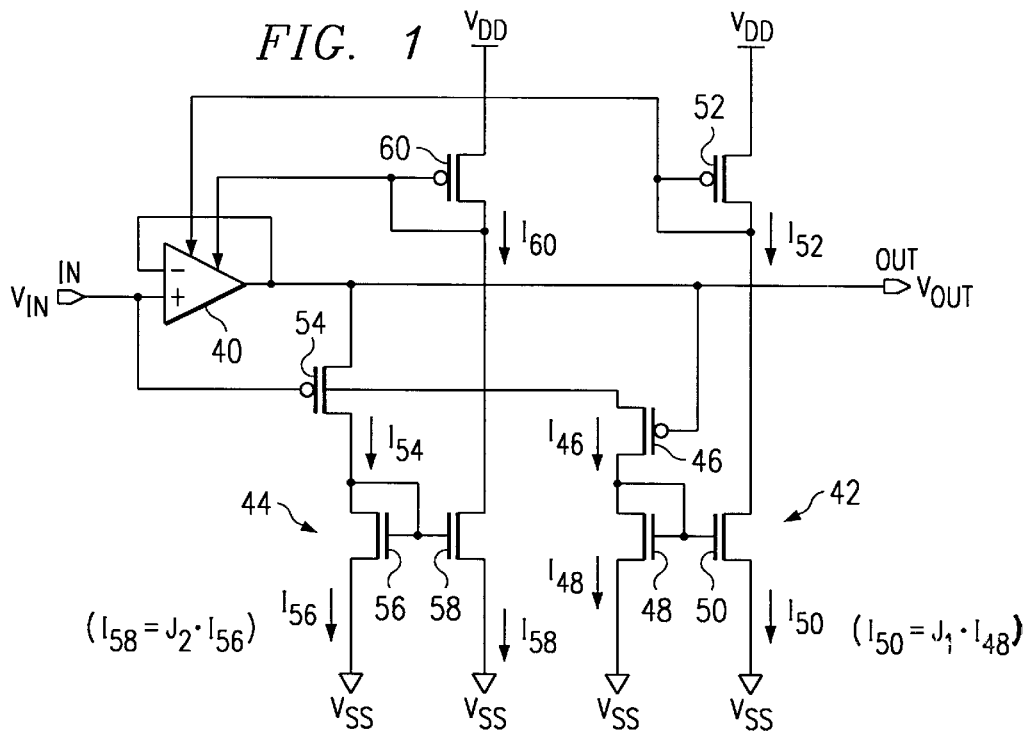
FIG. 1 shows the power-off detection circuit disclosed in the first example of the present invention.

In FIG. 1, 1 represents a first embodiment of the power-off detection circuit disclosed by the present invention. Said power-off detection circuit 1 has a detection circuit main body 10 and a gate voltage generating circuit 21.

Detection circuit main body 10 has detecting capacitor 1, resistor 12, diode 13, starting transistor 14, initializing transistor 15, and output transistor 17.

Initializing transistor 15 is a p-channel MOSFET. Its source terminal is connected to the power supply voltage Vcc, and its drain terminal is connected to latch circuit 33. Also, the gate terminal of initializing transistor 15 is connected to reset terminal 32 via inverter 31.

Output transistor 17 is an n-channel MOSFET. Its drain terminal is connected to the drain terminal of initializing transistor 15, and its source terminal is connected to ground potential.

When the power supply of a system in which said power-off detection circuit 1 is incorporated is turned on to raise the power supply voltage Vcc, first, a HIGH signal is input to reset terminal 32.

When the power supply voltage Vcc rises, as will be described below, output transistor 17 is off. On the other hand, initializing transistor 15 is turned on by the HIGH signal input to reset terminal 32.

When initializing transistor 15 is turned on, the input terminal of latch circuit 33 is connected to the power supply voltage Vcc. As a result, the HIGH signal is input to latch circuit 33.

Latch circuit 33 is comprised of two inverters in an inverse-parallel connection. The input HIGH signal is inverted and output as a LOW signal from the output terminal.

The LOW signal is inverted again by inverter 34 and is output from control terminal 35 to another circuit. As a result, depending on the HIGH signal input to reset terminal 32 when the power supply voltage Vcc rises, a HIGH signal is output from control terminal 35. Depending on this HIGH signal, another circuit in the system can detect the switching-on of the power supply voltage Vcc and start the operation.

Then, when the signal input to reset terminal 32 is converted from HIGH to LOW, initializing transistor 15 is turned off.

At that time, output transistor 17 is also in the off state. When initializing transistor 15 is turned off, the drain terminal of initializing transistor 15 and the drain terminal of output transistor 17 are cut off from both the power supply voltage Vcc and ground potential and are stabilized at the voltage held by latch circuit 33.

In said power-off detection circuit 1, resistor 12 and diode 13 are connected in series. One end is connected to the power supply voltage Vcc, while the other end is connected to the terminal on the high-voltage side of detecting capacitor 11. The terminal on the low-voltage side of detecting capacitor 11 is connected to ground potential.

The anode of diode 13 faces the side of the power supply Vcc, while its cathode faces the side of detecting capacitor 11. When diode 13 is turned on as a result of the rise in the power supply voltage Vcc, detecting capacitor 11 is connected to the power supply voltage Vcc via resistor 12 and diode 13. Detecting capacitor 11 is charged from the power supply voltage Vcc.

Starting transistor 14 is a p-channel MOSFET. Its source terminal and rear gate terminal are connected to the terminal of detecting capacitor 11 on the high-voltage side.

Also, the gate terminal of starting transistor 14 is connected to the power supply voltage Vcc. When detecting capacitor 11 is charged by the power supply voltage Vcc, starting transistor 14 is in the off state.

When the power of the system is turned off from that state and the power supply voltage Vcc drops, diode 13 is reverse-biased by the charge voltage on detecting capacitor 11. Since the source terminal of starting transistor 14 is connected to the terminal of detecting capacitor 11 on the high-voltage side, even if the power supply voltage Vcc drops, the voltage at the source terminal is maintained at the level of the voltage of detecting capacitor 11. However, since the gate terminal is directly connected to the power supply voltage Vcc, the voltage at the gate terminal drops. If the difference between the voltage at the gate terminal and the voltage at the source terminal is higher than the threshold voltage, starting transistor 14 is turned on.

In the first embodiment of power-off detection circuit 1, gate voltage generating circuit 21 is formed by resistor 25, one end of which is connected to the drain terminal of starting transistor 14 and the gate terminal of output transistor 17, and the other end of which is connected to ground potential.

Since the gate terminal of output transistor 17 is connected to the drain terminal of starting transistor 14, when the power of the system is on or when there is no current flow to resistor 25 before the power supply voltage Vcc drops, output transistor 17 is in the off state. At that time, starting transistor 14 is also in the off state because its gate terminal is connected to ground potential via resistor 25.

On the other hand, when starting transistor 14 is turned on as a result of the drop in the power supply voltage Vcc, the terminal of detecting capacitor 11 on the high-voltage side is connected to gate voltage generating circuit 21 via starting transistor 14. The discharge current from detecting capacitor 11 flows to resistor 25 via starting transistor 14.

When a voltage higher than the threshold voltage occurs across resistor 25 as a result of the discharge current, output transistor 17 is converted from the off state to the on state, and the input terminal of latch circuit 33 is connected to ground potential.

As a result, a LOW signal is input to the input terminal of latch circuit 33, and the signal output from control terminal 35 is inverted (the signal output from control terminal 35 is converted from HIGH to LOW).

Another circuit can detect the drop in the power supply voltage Vcc as a function of the signal inversion.

Figure 5:
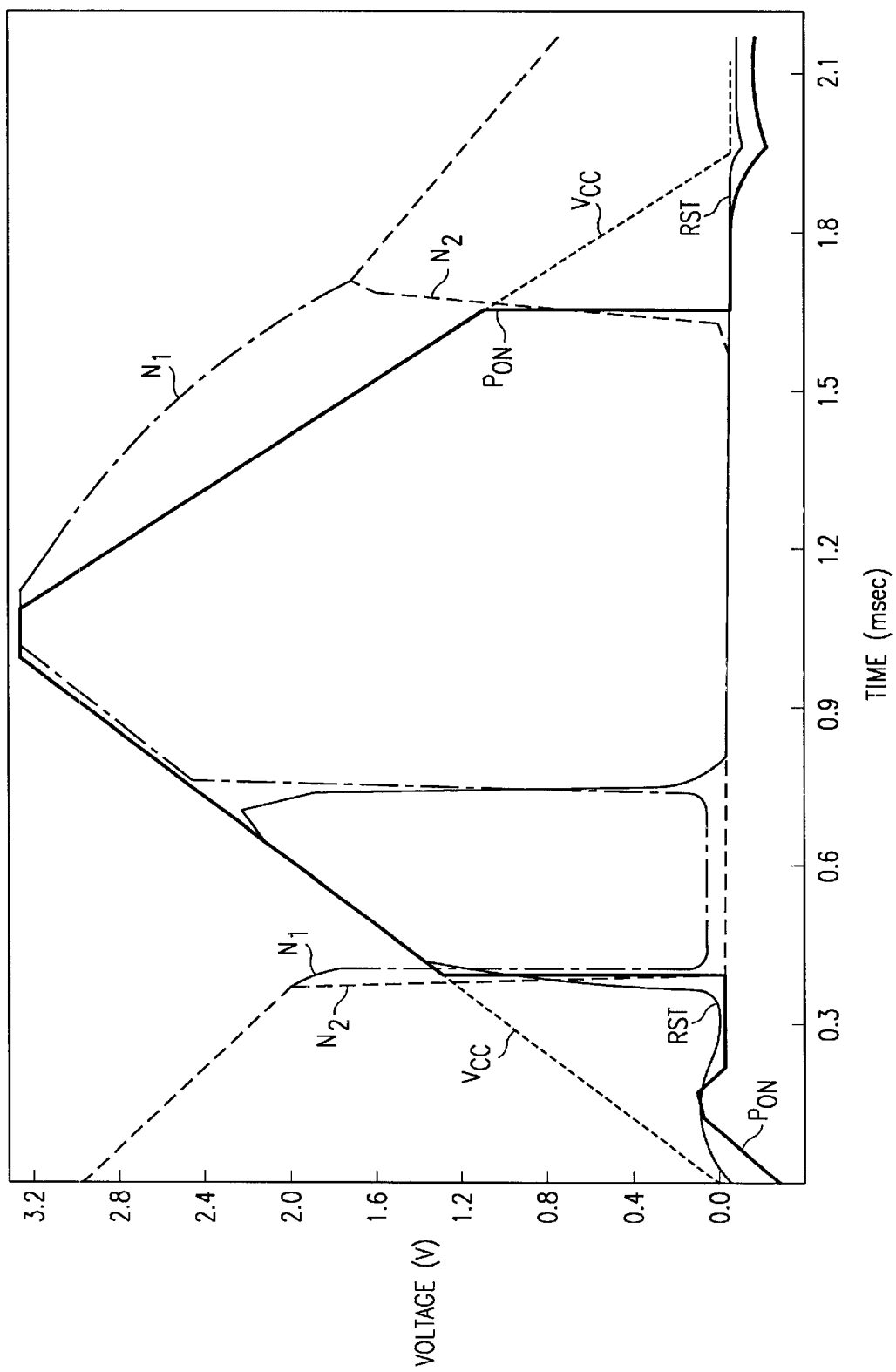
FIG. 5 is a diagram explaining the operation of the power-off detection circuit of the present invention.

FIG. 5 shows the operation of said power-off detection circuit 1. In this figure, Vcc represents the power supply voltage; RST represents the voltage at reset terminal 32; $N_1$ represents the voltage at the terminal of detecting capacitor 11 on the high-voltage side; $N_2$ represents the voltage at the gate terminal of output transistor 17; and Pon represents the voltage at control terminal 35.

The first reset transistor 16, an n-channel MOSFET, is connected in parallel with the detecting capacitor 11 of said power-off detection circuit 1.

The gate terminal of the first reset transistor 16 is connected to reset terminal 32. As shown in FIG. 5, when its operation is started from the charged state of detecting capacitor 11, first, a HIGH signal is input to reset terminal 32. When the voltage RST rises, the first reset transistor 16 is turned on, and detecting capacitor 11 is temporarily discharged (transition of voltage $N_1$ near 0.3 msec).

Then, when the voltage RST at reset terminal 32 drops, the first reset capacitor 16 is turned off, and detecting capacitor 11 is charged to a voltage near the power supply voltage Vcc.

When the power supply voltage Vcc drops to a level around 1.2 V from that state, starting transistor 14 is turned on, and the voltage $N_2$ at the gate terminal of output transistor 17 rises. Along with this voltage rise, the voltage Pon at control terminal 35 is inverted.

Another embodiment of the present will be explained below.

Figure 2:
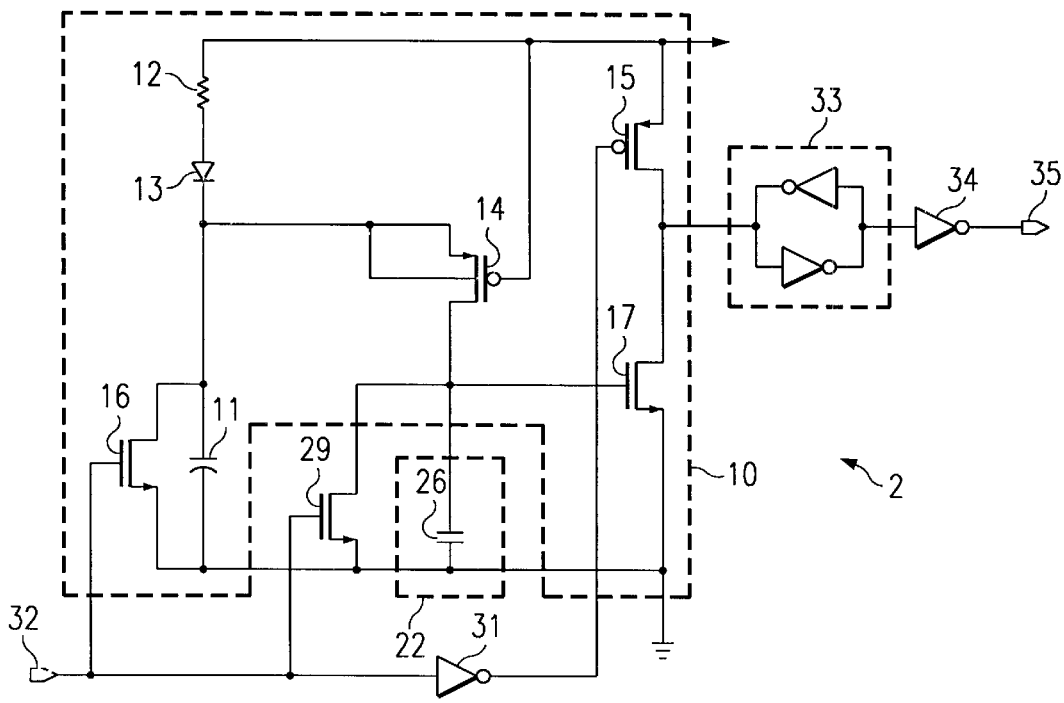
FIG. 2 shows the power-off detection circuit disclosed in the second example of the present invention.

Reference numeral 2 in FIG. 2 represents the second example of the power-off detection circuit disclosed in the present invention.

Said power-off detection circuit 2 has a detection circuit main body 10 and a gate voltage generating circuit 22.

The detection circuit main body 10 of said power-off detection circuit 2 has the same configuration as the detection circuit main body 10 explained in the first embodiment. However, gate voltage generating circuit 22 is different from the gate voltage generating circuit 21 used in the first example and is constituted by a capacitor 26.

The terminal of capacitor 22 on the high-voltage side is connected to the drain terminal of starting transistor 14 and to the gate terminal of output transistor 17. The terminal on the low-voltage side is connected to ground potential. Consequently, when the power supply voltage Vcc drops and starting transistor 14 goes from the off state to the on state, detecting capacitor 11 discharges. As a result, the capacitor 26 of gate voltage generating circuit 22 is charged by the discharge current.

Along with charging, the voltage of capacitor 26 on the high-voltage side rises. If the voltage at the gate terminal of output transistor 17 becomes higher than the threshold voltage, output transistor 17 is converted from the off state to the on state, and the signal output from control terminal 35 is inverted.

In the power-off detection circuit 1 disclosed in the first embodiment, when the power supply voltage Vcc drops slowly, since little current flows to resistor 25 that constitutes gate voltage generating circuit 22, in some cases, it is unable to generate a voltage higher than the threshold voltage for output transistor 17. In the power-off detection circuit 2 disclosed in the second embodiment, however, since the voltage applied to the gate terminal of output transistor 17 is generated by transferring the electric charge accumulated on detecting capacitor 11 to the capacitor 26 in gate voltage generating circuit 22, as long as the capacitance ratio of detecting capacitor 11 to capacitor 26 of gate voltage generating circuit 22 is set to an appropriate value, there will be no problem in turning on output transistor 17.

The second reset transistor 29 is connected in parallel with capacitor 26 that constitutes gate voltage generating circuit 22. The second reset capacitor 29 is constituted in such a way that it is controlled by the first reset transistor 16 and reset terminal 32.

Consequently, the detecting capacitor 11 and capacitor 26 that constitutes gate voltage generating circuit 22 are forcibly discharged and reset by the signal at reset terminal 32 at the same time.

In the following, a third embodiment of the power-off detection circuit disclosed by the present invention will be explained.

Figure 3:
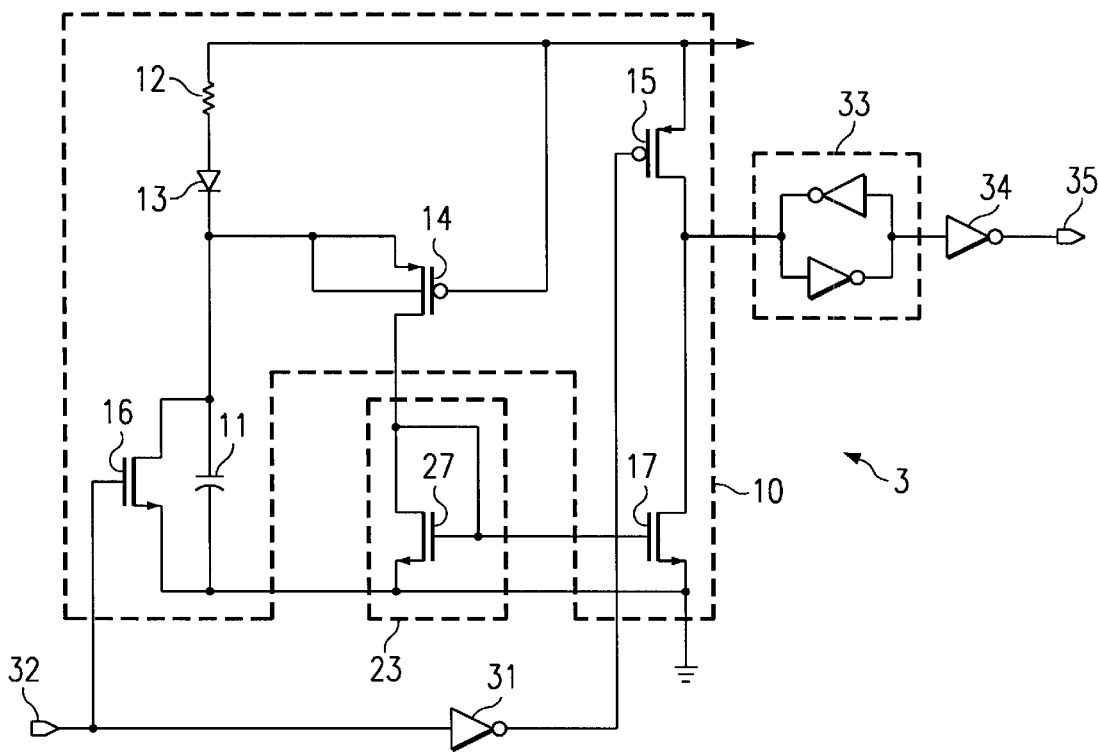
FIG. 3 shows the power-off detection circuit disclosed in the third example of the present invention.
Figure 6:
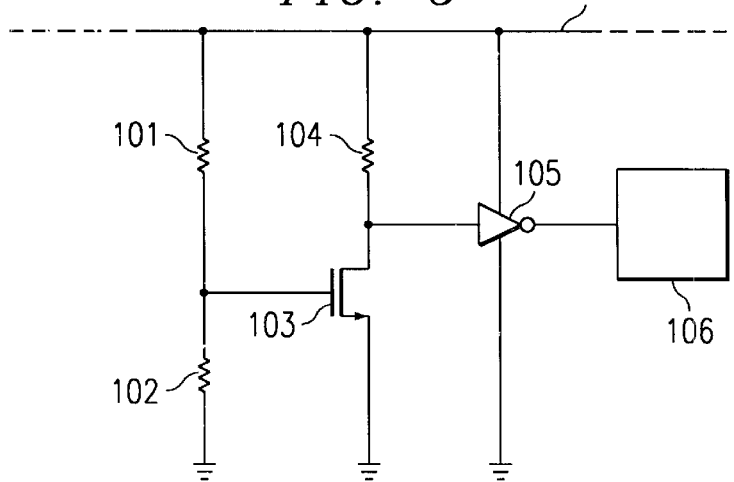
FIG. 6 shows a conventional power-off detection circuit

In FIG. 3, 3 represents a power-off detection circuit. It has a detection circuit main body 10 identical to those of the power-off detection circuits 1 and 2 disclosed in the first and second examples and a gate voltage generating circuit 23 unlike those of the power-off detection circuits 1 and 2 disclosed in the first and second examples.

Said gate voltage generating circuit 23 is constituted by a transistor 27, an n-channel MOSFET. The gate terminal and drain terminal of said transistor 27 are shorted to form a diode. The anode side (gate terminal and drain terminal) of the diode is connected to the drain terminal of starting transistor 14 and to the gate terminal of output transistor 17, while the cathode side is connected to ground potential.

When starting transistor 14 is turned on by said gate voltage generating circuit 23, current flows to diode-connected transistor 27. At that time, the voltage at the gate terminal of diode-connected transistor 27 rises to a level higher than the threshold voltage, and the voltage is applied to the gate terminal of output transistor 17. As a result, output transistor 17 is turned on, and the signal output from control terminal 35 is inverted.

In the power-off detection circuit 3 disclosed in the third example, a current mirror circuit is constituted by diode-connected transistor 27 and output transistor 17. Since the discharge current of detecting transistor 11 flows to diode-connected transistor 27, the voltage at the gate terminal of output transistor 17 will definitely rise to a level higher than the threshold voltage. Consequently, there is no problem in turning on output transistor 17 even if the power supply voltage Vcc drops slowly.

Figure 4:
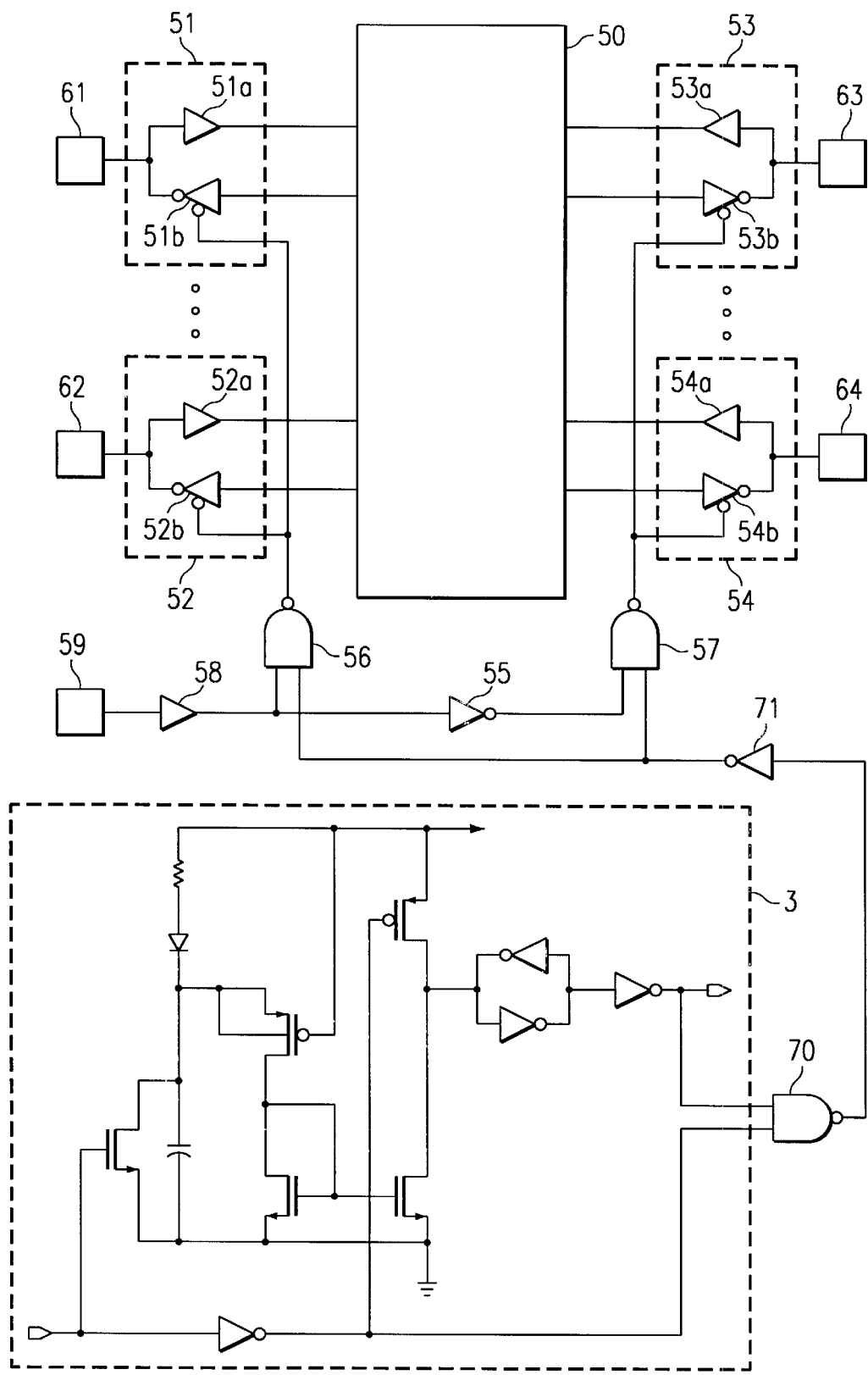
FIG. 4 shows an example of a system using the power-off detection circuit of the present invention.

FIG. 4 shows an example of a system using the power-off detection circuit 3 disclosed in the third example. 50 represents a transmitting/receiving LSI. The terminals of said LSI 50 are connected to input/output terminals 61–64 via multiple transmission/receiving switching circuits 51–54 (in this case, four transmission/receiving switching circuits are used).

A selection terminal 69 is connected to each of said transmission/receiving switching circuits 51–54 via buffer 58, inverter 55, and NAND gates 56 and 57.

The control terminal 35 of power-off detection circuit 3 is connected to inverter 55 as well as NAND gates 56 and 57 via NAND gate 70 and inverter 71. When a HIGH signal is input to control terminal 35 depending on the operation of inverter 55 as well as NAND gates 56 and 57, each of transmission/receiving switching circuits 51–54 is controlled corresponding to the signal input to selecting terminal 59 to control the transmitting/receiving direction of the data. When a LOW signal is input, the output of the transmitting/receiving buffer of each of transmission/receiving switching circuits 51–54 is switched to a high impedance state.

Transmission/receiving switching circuits 51–54 are constituted in such a way that the transmitting operation and receiving operation are selected depending on inverter 44 as well as NAND gates 56 and 57. When a HIGH or LOW signal is input to selecting terminal 59, the transmitting buffers 51b and 52b in transmission/receiving switching circuits 51 and 52 are activated and set for transmission. On the other hand, the outputs of the transmitting buffers 53b and 54b in transmission/receiving switching circuits 53 and 54, respectively, are switched to the high impedance state and set for receiving. Consequently, depending on transmission/receiving switching circuits 51–54, input/output terminals 61–64 can be used for both signal transmission and receiving.

As explained above, in the power-off detection circuit of the present invention, when the power supply voltage Vcc is constantly high, no current will flow, and the power consumption becomes low.

Also, since the operation of the starting transistor starts when the power supply voltage Vcc drops to a prescribed level, the sensitivity is high, and it can be used for various types of power supply voltages Vcc.

What is claimed is:

1. A power-off detection circuit comprising:

a diode, which is electrically coupled between first and second power supply terminals, a first capacitor, which is electrically coupled between the diode and the second power supply terminal and is charged from the first power supply terminal via the diode, a first output transistor, which is electrically coupled between the first and second power supply terminals to output logic signals, a control transistor, which is electrically coupled between a first node connecting the diode to the first capacitor and the control terminal of the first output transistor, with its control terminal electrically coupled to the first power supply terminal, a voltage generating circuit, which is electrically coupled between a second node coupling the control transistor to the control terminal of the first output transistor and the second power supply terminal, wherein the voltage generating circuit comprises a second capacitor coupled in parallel to the first capacitor via the control transistor whereby current discharged from the first capacitor charges the second capacitor to change the state of the output transistor.

2. The power-off detection circuit described in claim 1 further comprising a first reset transistor, which is electrically connected between the node connecting the diode and the first capacitor and the second power supply terminal, and which is turned on corresponding to a reset signal to discharge the first capacitor.

3. The power-off detection circuit described in claim 1 further comprising a second output transistor, which is electrically connected between the first power supply terminal and the first output transistor and having a reset signal applied to its control terminal.

4. The power-off detection circuit described in claim 1 wherein the power-off detection circuit has a second reset transistor which is turned on corresponding to the reset signal to discharge the second capacitor.

5. The power-off detection circuit described in claim 2 further comprising a second output transistor, which is electrically connected between the first power supply terminal and the first output transistor and having a reset signal applied to its control terminal.

6. The power-off detection circuit described in claim 2 wherein the voltage generating circuit is a transistor which can form a current mirror circuit together with the first output transistor.

* * * * *